US011294541B2

(12) United States Patent
Wu (10) Patent No.: US 11,294,541 B2
(45) Date of Patent: Apr. 5, 2022

(54) METHOD, SYSTEM, AND DEVICE FOR DISPLAYING GEOMETRY IN EDITOR, AND MEDIUM

(71) Applicant: Shanghai Lilith Technology Corporation, Shanghai (CN)

(72) Inventor: Di Wu, Shanghai (CN)

(73) Assignee: Shanghai Lilith Technology Corporation, Shanghai (CN)

(*) Notice: Subject to any disclaimer, the term of this patent is extended or adjusted under 35 U.S.C. 154(b) by 0 days.

(21) Appl. No.: 17/277,695

(22) PCT Filed: Dec. 14, 2018

(86) PCT No.: PCT/CN2018/121228
§ 371 (c)(1),
(2) Date: Mar. 18, 2021

(87) PCT Pub. No.: WO2020/073483
PCT Pub. Date: Apr. 16, 2020

(65) Prior Publication Data
US 2021/0311596 A1   Oct. 7, 2021

(30) Foreign Application Priority Data
Oct. 9, 2018   (CN) .......................... 201811172631.6

(51) Int. Cl.
*G06F 3/0482*   (2013.01)
*G06T 11/60*   (2006.01)

(52) U.S. Cl.
CPC ............ *G06F 3/0482* (2013.01); *G06T 11/60* (2013.01)

(58) Field of Classification Search
CPC ................................. G06F 3/0482; G06T 11/60
See application file for complete search history.

(56) References Cited

U.S. PATENT DOCUMENTS 7,739,623 B2 * 6/2010 Liang ...................... G06T 15/08
715/848
8,023,768 B2 * 9/2011 Wilensky ................ H04L 45/50
382/283

(Continued)

FOREIGN PATENT DOCUMENTS

CN          101198957 A       6/2008
CN          101339575 A       1/2009

(Continued)

OTHER PUBLICATIONS

Yang et al., "Generating Levels of Detail of 3D Building Models Based on Cutting Loops Decomposition", Oct. 2011.

(Continued)

*Primary Examiner* — Anil K Bhargava
(74) *Attorney, Agent, or Firm* — David R. Stevens; Stevens Law Group (57) ABSTRACT

A method, a system, a medium, and a device may be used for displaying a geometry in an editor, in the technical field of two-dimensional/three-dimensional modeling. The method for displaying a geometry in an editor comprises: determining a Boolean operation and a plurality of geometries in a space window (102); calculating the plurality of geometries in the space window according to the Boolean operation, so as to obtain a composite geometry in the space window (104); creating a plurality of objects in the resource list, wherein the plurality of objects respectively correspond to the composite geometry and the plurality of geometries that are calculated to obtain the composite geometry, and setting objects corresponding to the plurality of geometries as sub-nodes of an object corresponding to the composite geometry; and returning to the step of determining a Boolean operation and a plurality of geometries in the space window.

16 Claims, 6 Drawing Sheets

(56) References Cited

U.S. PATENT DOCUMENTS

| | | | | |
|---|---|---|---|---|
| 10,325,035 | B2* | 6/2019 | Kelly | G06T 19/00 |
| 2008/0144970 | A1* | 6/2008 | Wilensky | G06K 9/48 |
| | | | | 382/283 |
| 2014/0035950 | A1* | 2/2014 | Jonsson | G06T 11/60 |
| | | | | 345/629 |
| 2017/0132838 | A1* | 5/2017 | Lipp | G06T 17/20 |

FOREIGN PATENT DOCUMENTS

| | | | |
|---|---|---|---|
| CN | 102722912 | A | 10/2012 |
| CN | 102855663 | A | 1/2013 |
| CN | 102930026 | A | 2/2013 |
| CN | 105488627 | A | 4/2016 |
| CN | 106447777 | A | 2/2017 |
| CN | 106528929 | A | 3/2017 |
| CN | 107038749 | A | 8/2017 |
| KR | 20120001114 | A | 1/2012 |

OTHER PUBLICATIONS

Zhang, JuFeng, "Solid Modeling Techniques and its Applications", Chinese Master's full-text Database Information Science and Technology, No. 11, p. T135-13, Apr. 13, 2016.

\* cited by examiner

METHOD, SYSTEM, AND DEVICE FOR DISPLAYING GEOMETRY IN EDITOR, AND MEDIUM

TECHNICAL FIELD

The present disclosure relates to a technical field of two-dimensional (2D)/three-dimensional (3D) modeling, and in particular to a method, a system, a device for displaying a geometry in an editor, and a medium.

BACKGROUND

In an editor of a 2D/3D modeling software, users can obtain a composite geometry by calculating plurality of simple geometries. Calculations include intersection, union, negation, etc. Such calculations are generally referred to Boolean operations. In addition, in order to obtain more complex composite geometries, plurality of Boolean operations are often required, and a current Boolean operation is performed on a result of a previous Boolean operation.

Figure 1:
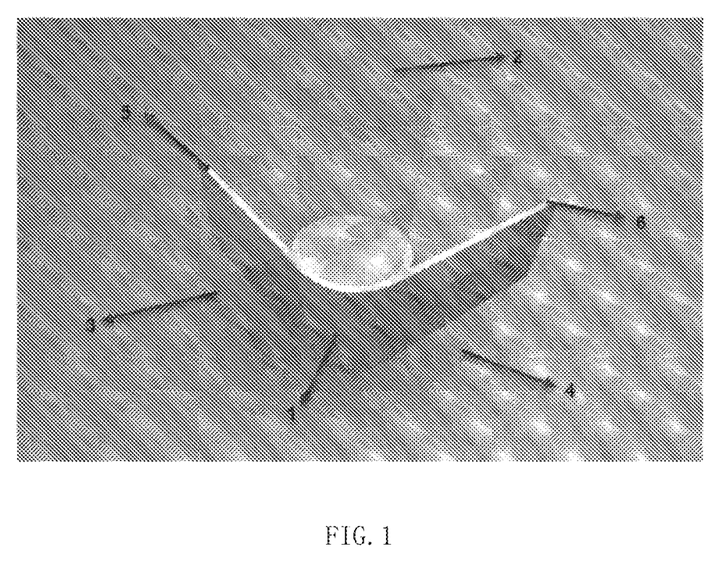
FIG. 1 is a schematic diagram of a rounded corner wall obtained in an editor according to the prior art.

In the prior art, as shown in FIG. 1, in order to obtain a rounded corner wall in an editor, the following steps are usually included: 1) Generate a cylinder 1; 2) Generate a cylinder 2, and set the cylinder 2 to be in a negation state; 3) Merge the cylinder 1 with the negation of cylinder 2 to form a first geometry, that is, a hollow cylinder; 4) Generate a cuboid 3, and set the cuboid 3 to be in a negation state; 5) Merge the first geometry with the negation of the cuboid 3 to form a second geometry, that is, a one-half hollow cylinder; 6) Generate a cuboid 4 and set the cuboid 4 to be in a negation state; 7) Merge the second geometry with the negation of the cuboid 4 to form a third geometry, that is, a quarter hollow cylinder; 8) Generate a cuboid 5 and a cuboid 6; 9) Merge the third geometry with the cuboid 5 and the cuboid 6 to form a fourth geometry, that is, the rounded corner wall.

However, only the rounded corner wall obtained by plurality of Boolean operations is stored in the prior art. If the user wants to modify a thickness of the wall, such as reduce a diameter of the cylinder 2, the user can only redo the above steps. Consequently, in the prior art, only a final geometry obtained by plurality of Boolean operations is displayed, a subordination relationship between the final geometry and an intermediate geometry cannot be intuitively displayed, and the intermediate geometry cannot be directly modified.

SUMMARY

An objective of the present disclosure is to provide a method, a system, and a device for displaying a geometry in an editor, and a medium, to solve a technical problem in the prior art that only a final geometry obtained by a plurality of Boolean operations is displayed, a subordination relationship between the final geometry and an intermediate geometry cannot be intuitively displayed, and the intermediate geometry cannot be directly modified.

An embodiment of the present disclosure discloses a method for displaying a geometry in an editor, where the editor includes a space window and a resource list, and the method includes:
  determining a Boolean operation and a plurality of geometries in the space window;
  calculating the plurality of geometries in the space window according to the Boolean operation to obtain a composite geometry in the space window;
  creating a plurality of objects in the resource list, wherein the plurality of objects respectively correspond to the composite geometry and the plurality of geometries that are calculated to obtain the composite geometry, and setting objects corresponding to the plurality of geometries as sub-nodes of an object corresponding to the composite geometry; and
  returning to the step of determining a Boolean operation and a plurality of geometries in the space window, wherein when it is determined that there is no Boolean operation, the obtained composite geometry in the space window is a final composite geometry, and the plurality of objects created in the resource list are final objects.

Optionally, when the plurality of geometries in the space window are determined, the plurality of geometries comprise a composite geometry.

Optionally, if a geometry corresponding to an object that is set as a sub-node is a composite geometry, a plurality of objects are further created in the resource list, wherein the plurality of objects respectively correspond to the plurality of geometries that are calculated to obtain the composite geometry, and the plurality of objects are set as sub-nodes of the object that is set as a sub-node.

Optionally, the object with sub-nodes comprises an expanded state and a retracted state.

Optionally, when the object with sub-nodes is switched from the retracted state to the expanded state,
  the object with sub-nodes and the object that is set as a sub-node are set to be displayed in the resource list; and
  the geometry corresponding to the object with sub-nodes is set to be hidden in the space window, and the geometry corresponding to the object that is set as a sub-node is set to be displayed.

Optionally, if the geometry corresponding to the object that is set as a sub-node is a composite geometry, the object corresponding to the composite geometry is switched from the retracted state to the expanded state.

Optionally, when the object with sub-nodes is switched from the expanded state to the retracted state,
  it is determined whether the geometry corresponding to the object that is set as a sub-node is modified;
  if the geometry corresponding to the object that is set as a sub-node is modified, the Boolean operation is re-performed on the modified geometry and the remaining unmodified geometry, wherein the Boolean operation is performed to obtain the geometry corresponding to the object with sub-nodes, so as to obtain a new composite geometry in the space window; a plurality of new objects are created in the resource list, wherein the plurality of new objects respectively correspond to the new composite geometry, the modified geometry, and the remaining unmodified geometry, and replace the object with sub-nodes and the object that is set as a sub-node; the object corresponding to the new composite geometry is set to be displayed, and the objects corresponding to the modified geometry and the remaining unmodified geometry are set to be hidden; the new composite geometry is set to be displayed and the modified geometry and the remaining unmodified geometry are set to be hidden in the space window; and
  if no geometry corresponding to the object that is set as a sub-node is modified, the object with sub-nodes is set to be displayed and the object that is set as a sub-node is set to be hidden in the resource list; the geometry corresponding to the object with sub-nodes is set to be displayed and the geometry corresponding to the object that is set as a sub-node is set to be hidden in the space window.

Optionally, if the geometry corresponding to the object that is set as a sub-node is modified, the Boolean operation is re-performed on the modified geometry and the remaining unmodified geometry, wherein the Boolean operation is performed to obtain the geometry corresponding to the object with sub-nodes, so as to obtain a new composite geometry in the space window; a plurality of new objects are created in the resource list, wherein the plurality of new objects respectively correspond to the new composite geometry and the modified geometry, and replace the object with sub-nodes and the object corresponding to the geometry to be modified; the object corresponding to the new composite geometry is set to be displayed, and the objects corresponding to the modified geometry and the remaining unmodified geometry are set to be hidden; the new composite geometry is set to be displayed and the modified geometry and the remaining unmodified geometry are set to be hidden in the space window.

Optionally, if the geometry corresponding to the object that is set as a sub-node is modified, the Boolean operation is re-performed on the modified geometry and the remaining unmodified geometry, and the Boolean operation is performed to obtain the geometry corresponding to the object with sub-nodes, so as to obtain a new composite geometry in the space window; in the resource list, the object with sub-nodes corresponds to the new composite geometry, and the object corresponding to the geometry to be modified corresponds to the modified geometry; the object corresponding to the new composite geometry is set to be displayed, and the objects corresponding to the modified geometry and the remaining unmodified geometry is set to be hidden; the new composite geometry is set to be displayed and the modified geometry and the remaining unmodified geometry are set to be hidden in the space window.

Optionally, if the geometry to be modified is a composite geometry, the object corresponding to the composite geometry is switched from the expanded state to the retracted state.

An embodiment of the present disclosure further discloses a system for displaying a geometry in an editor, where the editor includes a space window and a resource list, and the system includes:
  a determining unit configured to determine a Boolean operation and a plurality of geometries in the space window;
  a calculation unit configured to calculate the plurality of geometries in the space window according to the Boolean operation to obtain a composite geometry in the space window;
  an object creating unit configured to create a plurality of objects in the resource list, wherein the plurality of objects respectively correspond to the composite geometry and the plurality of geometries that are calculated to obtain the composite geometry, and set the objects corresponding to the plurality of geometries as sub-nodes of an object corresponding to the composite geometry; and
  return to the determining unit, wherein when the determining unit determines that there is no Boolean operation, the composite geometry obtained by the calculation unit in the space window is a final composite geometry, and the plurality of objects created by the object creating unit in the resource list are final objects.

Optionally, when the plurality of geometries in the space window are determined, the plurality of geometries comprise a composite geometry.

Optionally, if the geometry corresponding to an object that is set as a sub-node is a composite geometry, the object creating unit further creates a plurality of objects in the resource list, wherein the plurality of objects respectively correspond to the plurality of geometries that are calculated to obtain the composite geometry, and set the plurality of objects as sub-nodes of the object that is set as a sub-node.

Optionally, the object with sub-nodes comprises an expanded state and a retracted state.

Optionally, the system further comprises an object state switching unit, and when the object with sub-nodes is switched from the retracted state to the expanded state, the object state switching unit is configured to:
  set the object with sub-nodes and the object that is set as a sub-node to be displayed in the resource list; and
  set the geometry corresponding to the object with sub-nodes to be hidden in the space window, and set the geometry corresponding to the object that is set as a sub-node to be displayed.

Optionally, if the geometry corresponding to the object that is set as a sub-node is a composite geometry, the object state switching unit is configured to switch the object corresponding to the composite geometry from the retracted state to the expanded state.

Optionally, the system further comprises an object state switching unit, and when the object with sub-nodes is switched from the expanded state to the retracted state, the object state switching unit is configured to:
  determine whether the geometry corresponding to the object that is set as a sub-node is modified;
  if the geometry corresponding to the object that is set as a sub-node is modified, re-perform the Boolean operation on the modified geometry and the remaining unmodified geometry, wherein the Boolean operation is performed to obtain the geometry corresponding to the object with sub-nodes, so as to obtain a new composite geometry in the space window; create a plurality of new objects in the resource list, wherein the plurality of new objects respectively correspond to the new composite geometry, the modified geometry, and the remaining unmodified geometry, and replace the object with sub-nodes and the object that is set as a sub-node; set the object corresponding to the new composite geometry to be displayed, and set the objects corresponding to the modified geometry and the remaining unmodified geometry to be hidden; set the new composite geometry be displayed, and set the modified geometry and the remaining unmodified geometry to be hidden in the space window; and
  if no geometry corresponding to the object that is set as a sub-node is modified, set the object with sub-nodes to be displayed and set the object that is set as a sub-node to be hidden in the resource list; set the geometry corresponding to the object with sub-nodes to be displayed and set the geometry corresponding to the object that is set as a sub-node to be hidden in the space window.

Optionally, if the geometry corresponding to the object that is set as a sub-node is modified, the Boolean operation is re-performed on the modified geometry and the remaining unmodified geometry, wherein the Boolean operation is performed to obtain the geometry corresponding to the object with sub-nodes, so as to obtain a new composite geometry in the space window; a plurality of new objects are created in the resource list, and the plurality of new objects respectively correspond to the new composite geometry and the modified geometry, and replace the object with subnodes and the object corresponding to the geometry to be modified; the object corresponding to the new composite geometry is set to be displayed, and the objects corresponding to the modified geometry and the remaining unmodified geometry are set to be hidden; the new composite geometry is set to be displayed and the modified geometry and the remaining unmodified geometry are set to be hidden in the space window.

Optionally, if the geometry corresponding to the object that is set as a sub-node is modified, the Boolean operation is re-performed on the modified geometry and the remaining unmodified geometry, and the Boolean operation is performed to obtain the geometry corresponding to the object with sub-nodes, so as to obtain a new composite geometry in the space window; in the resource list, the object with sub-nodes corresponds to the new composite geometry, and the object corresponding to the geometry to be modified corresponds to the modified geometry; the object corresponding to the new composite geometry is set to be displayed, and the objects corresponding to the modified geometry and the remaining unmodified geometry are set to be hidden; the new composite geometry is set to be displayed and the modified geometry and the remaining unmodified geometry are set to be hidden in the space window.

Optionally, if the geometry to be modified is a composite geometry, the object state switching unit is used to switch the object corresponding to the composite geometry from the expanded state to the retracted state.

An embodiment of the present disclosure further discloses a device for displaying a geometry in an editor, the device includes a memory in which a computer-executable instruction is stored and a processor, and the processor is configured to execute the instruction to implement a method for displaying a geometry in an editor.

An embodiment of the present disclosure further discloses a non-volatile computer storage medium coded with a computer program, where the computer program includes an instruction, and the instruction is executed by more than one computer to implement a method for displaying a geometry in an editor.

Compared with the prior art, main differences and effects of the embodiments of the present disclosure are as follows:

In the present disclosure, the objects in the resource list correspond to the geometries in the space window, and there is a hierarchical relationship between the objects in the resource list, so as to intuitively display a composite geometry and a subordination relationship between the plurality of geometries that are calculated to obtain the composite geometry in the space window. In addition, an object with sub-nodes includes an expanded state and a retracted state. The user can directly modify an object that is set as a sub-node, thereby modifying a geometry corresponding to the object with sub-nodes.

DETAILED DESCRIPTION OF EMBODIMENTS

In the following description, many technical details are proposed for the reader to better understand the application. However, a person of ordinary skill in the art can understand that the technical solutions protected by the claims of this application can be implemented even without these technical details and various changes and modifications based on the following embodiments.

In order to make the objectives, technical solutions and advantages of the present disclosure clearer, the embodiments of the present disclosure are described in further detail below with reference to the accompanying drawings.

Figure 2:
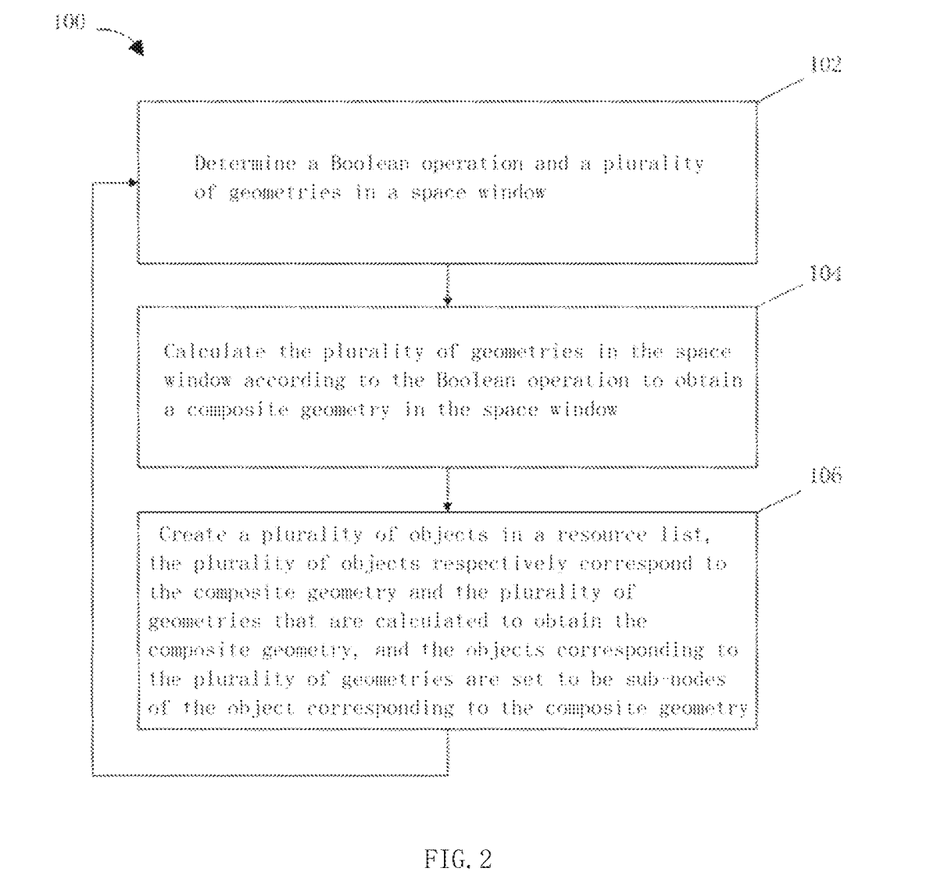
FIG. 2 is a schematic flowchart of a method for displaying a geometry in an editor.

A first embodiment of the present disclosure relates to a method of displaying a geometry in an editor. The editor includes a space window and a resource list. The space window can display 2D/3D models of geometries, and the resource list can display a hierarchical relationship between objects. FIG. 2 is a schematic flowchart of a method for displaying a geometry in an editor. As shown in FIG. 2, the method 100 includes:

Step 102: Determine a Boolean operation and a plurality of geometries in a space window.

Specifically, the Boolean operation and the plurality of geometries in the space window can be received from a user. The Boolean operation includes intersection, union, negation, etc. The plurality of geometries include 2D geometries, such as cylinders, rectangles, circles, etc., and/or 3D geometries, such as cylinders, cuboids, spheres, etc. In step 102, it is possible to determine the Boolean operation and the plurality of geometries that are calculated to obtain a composite geometry.

Step 104: Calculate the plurality of geometries in the space window according to the Boolean operation to obtain a composite geometry in the space window.

The composite geometry includes a 2D geometry, such as a polygon, and/or a 3D geometry, such as a rounded corner wall. The composite geometry can be obtained in step 104.

Step 106: Create a plurality of objects in the resource list. The plurality of objects correspond to the plurality of geometries that are calculated to obtain the composite geometry and the composite geometry. It sets the objects corresponding to the plurality of geometries as sub-nodes of the object corresponding to the composite geometry.

In step 106, a corresponding relationship between the objects in the resource list and the geometries in the space window can be implemented, and there is a hierarchical relationship between the objects in the resource list, so that a subordination relationship between the composite geometry in the space window and the plurality of geometries that are calculated to obtain the composite geometry can be intuitively displayed.

Return to step 102. When it is determined that there is no Boolean operation, the obtained composite geometry in the space window is a final composite geometry, and the plurality of objects created in the resource list are final objects.

Specifically, when the Boolean operation is no longer received from the user, the obtained composite geometry in the space window is the final composite geometry, and the plurality of objects created in the resource list are the final objects.

Figure 3:
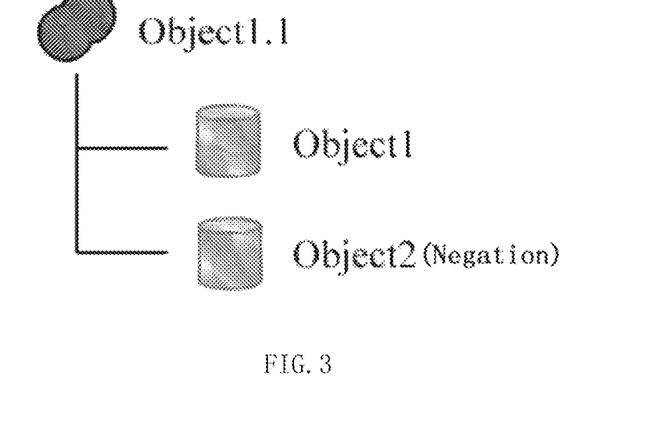
FIG. 3 is a schematic diagram of a hierarchical relationship of a plurality of objects in a resource list.

FIG. 3 is a schematic diagram of a hierarchical relationship of a plurality of objects in a resource list. As shown in FIG. 3, for example, it is determined that a Boolean operation is intersection, and it is determined that the plurality of geometries in a space window are a cylinder Geometry1 and a negation cylinder Geometry2 (negation). The plurality of geometries Geometry1, Geometry2 (negation) in the space window are calculated according to the Boolean operation to obtain a composite geometry Geometry1.1 in the space window. A plurality of objects Object1.1, Object1, Object2 (negation) are created in the resource list. The plurality of objects Object1.1, Object1, Object2 (negation) respectively correspond to the composite geometry Geometry1.1, and the plurality of geometries Geometry1 and Geometry2 (negation) that calculated to obtain the composite geometry Geometry1.1. The objects Object1 and Object2 (negation) corresponding to the plurality of geometries Geometry1, Geometry2 (negation) are set as sub-nodes of the object Object1.1 corresponding to the composite geometry Geometry1.1.

Return to the step of determining a Boolean operation and the plurality of geometries in a space window. When it is determined that there is no Boolean operation, the composite geometry Geometry1.1 obtained in the space window is a final composite geometry, and the plurality of objects Object1.1, Object1, Object2 (negation) created in the resource list are final objects.

Optionally, when the plurality of geometries in the space window are determined, the plurality of geometries include a composite geometry.

Specifically, the composite geometry and/or a newly added geometry may be received from a user. Therefore, the user can perform calculation on the composite geometry again. In this way, a more complex composite geometry can be obtained by a plurality of Boolean operations. A current Boolean operation is performed on a result of a previous Boolean operation.

Figure 4:
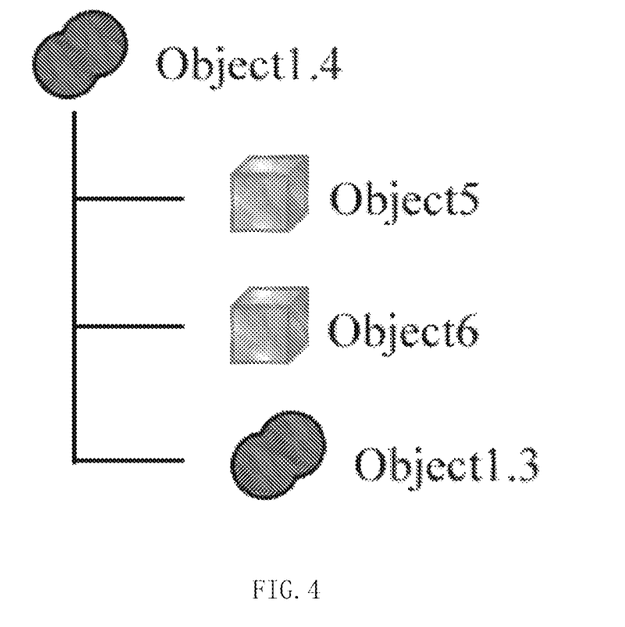
FIG. 4 is another schematic diagram of a hierarchical relationship of a plurality of objects in a resource list.

FIG. 4 is another schematic diagram of a hierarchical relationship of a plurality of objects in a resource list. As shown in FIG. 4, as an example discussed in FIG. 3, return to the step of determining a Boolean operation and the plurality of geometries in the space window. It is determined that the Boolean operation is intersection, and it is determined that the plurality of geometries in the space window are a negation cuboid Geometry3 (negation) and the composite geometry Geometry1.1. The plurality of geometries Geometry3 (negation), Geometry1.1 in the space window are calculated according to the Boolean operation to obtain a composite geometry Geometry1.2 in the space window. A plurality of objects Object1.2, Object3 (negation), Object1.1 are created in the resource list. The plurality of objects Object1.2, Object3 (negation), Object1.1 respectively correspond to the composite geometry Geometry1.2 and the plurality of geometries Geometry3 (negation), Geometry1.1 that calculated to obtain the composite geometry Geometry1.2. The objects Object3 (negation), Object1.1 corresponding to the plurality of geometries Geometry3 (negation), Geometry1.1 are set as sub-nodes of the object Object1.2 corresponding to the composite geometry Geometry1.2.

Return to the step of determining a Boolean operation and a plurality of geometries in the space window. It is determined that the Boolean operation is intersection, and it is determined that the plurality of geometries in the space window are negation cuboid Geometry4 (negation) and the composite geometry Geometry1.2. The plurality of geometries Geometry4 (negation), Geometry1.2 in the space window are calculated according to the Boolean operation to obtain a composite geometry Geometry1.3 in the space window. A plurality of objects Object1.3, Object4 (negation), Object1.2 are created in the resource list. The plurality of objects Object1.3, Object4 (negation), Object1.2 respectively correspond to the composite geometry Geometry1.3 and the plurality of geometries Geometry4 (negation), Geometry1.2 that calculated to obtain the composite geometry Geometry1.3. The objects Object4 (negation), Object1.2 corresponding to the plurality of geometries Geometry4 (negation), Geometry1.2 are set as sub-nodes of the object Object1.3 corresponding to the composite geometry Geometry1.3.

Return to the step of determining a Boolean operation and a plurality of geometries in the space window. It is determined that the Boolean operation is intersection, and it is determined that the plurality of geometries in the space window are a cuboid Geometry5, a cuboid Geometry6, and the composite geometry Geometry1.3. The plurality of geometries Geometry5, Geometry6, Geometry1.3 in the space window are calculated according to the Boolean operation to obtain a composite geometry Geometry1.4 in the space window. A plurality of objects Object1.4, Object5, Object6, Object1.3 are created in the resource list. The plurality of objects Object1.4, Object5, Object6, Object1.3 respectively correspond to the composite geometry Geometry1.4 and the plurality of geometries Geometry5, Geometry6, and Geometry1.3 that are calculated to obtain the composite geometry Geometry1.4. The objects Object5, Object6, and Object1.3 corresponding to the plurality of geometries Geometry5, Geometry6, and Geometry1.3 are set as sub-nodes of the object Object1.4 corresponding to the composite geometry Geometry1.4.

Return to the step of determining a Boolean operation and a plurality of geometries in the space window. When it is determined that there is no Boolean operation, the obtained composite geometry Geometry1.4 in the space window is the final composite geometry, and the plurality of objects Object1.4, Object5, Object6, and Object1.3 created in the resource list are the final objects.

Optionally, if the geometry corresponding to the object set as a sub-node is a composite geometry, a plurality of objects are further created in the resource list. The plurality of objects respectively correspond to a plurality of geometries that are calculated to obtain the composite geometry, and the plurality of objects are set as sub-nodes of the object that is set as a sub-node.

Therefore, the objects in the resource list have a clearer hierarchical relationship, so that a clearer subordination relationship between a plurality of geometries in the space window can be intuitively displayed.

Figure 5:
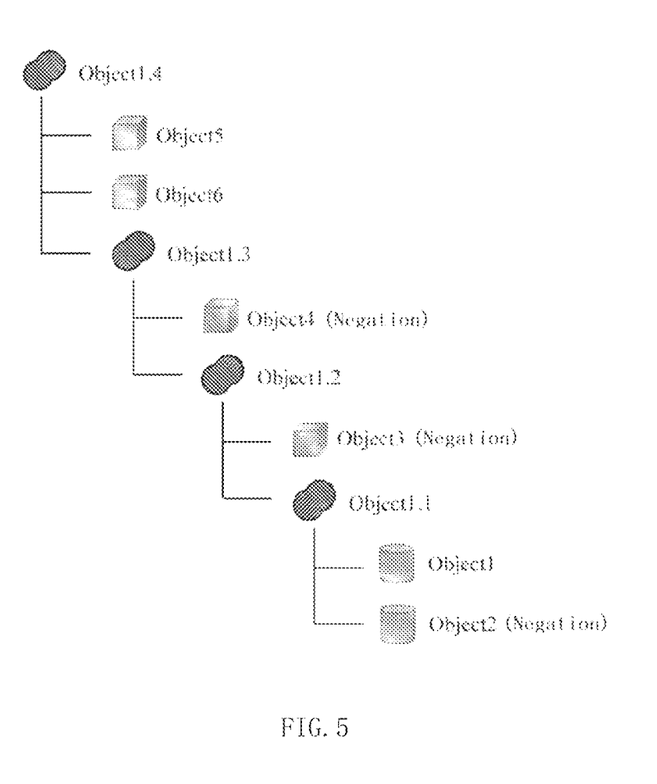
FIG. 5 is another schematic diagram of a hierarchical relationship of a plurality of objects in a resource list.

FIG. 5 is another schematic diagram of a hierarchical relationship of a plurality of objects in a resource list. As shown in FIG. 5, as the example discussed in FIG. 4, the geometry Geometry1.3 corresponding to the object Object1.3 that is set as a sub-node is a composite geometry. A plurality of objects Object4 (negation), Object1.2 are further created in the resource list. The plurality of objects Object4 (negation) and Object1.2 respectively correspond to the a plurality of geometries Geometry4 (negation) and Geometry1.2 that are calculated to obtain the composite geometry Geometry1.3. The plurality of objects Object4 (negation) and Object1.2 are set as sub-nodes of the object Object1.3 that is set as a sub-node.

The geometry Geometry1.2 corresponding to the object Object1.2 that is set as a sub-node is a composite geometry. A plurality of objects Object3 (negation), Object1.1 are further created in the resource list. The plurality of objects Object3 (negation), Object1.1 respectively correspond to a plurality of geometries Geometry3 (negation), Geometry1.1 that are calculated to obtain the composite geometry Geometry1.2. The plurality of objects Object3 (negation), Object1.1 are set as sub-nodes of the object Object1.2 that is set as a sub-node.

The geometry Geometry1.1 corresponding to the object Object1.1 that is set as a sub-node is a composite geometry. A plurality of objects Object1, Object2 (negation) are further created in the resource list. The plurality of objects Object1, Object2 (negation) respectively correspond to a plurality of geometries Geometry1, Geometry2 (negation) that calculated to obtain the composite geometry Geometry1.1. The plurality of objects Object1, Object2 (negation) are set as sub-nodes of the object Object1.1 that is set as a sub-node.

Optionally, the object with sub-nodes includes an expanded state and a retracted state.

Therefore, the user can directly modify the object that is set as a sub-node, thereby modifying the geometry corresponding to the object with sub-nodes.

Figure 6:
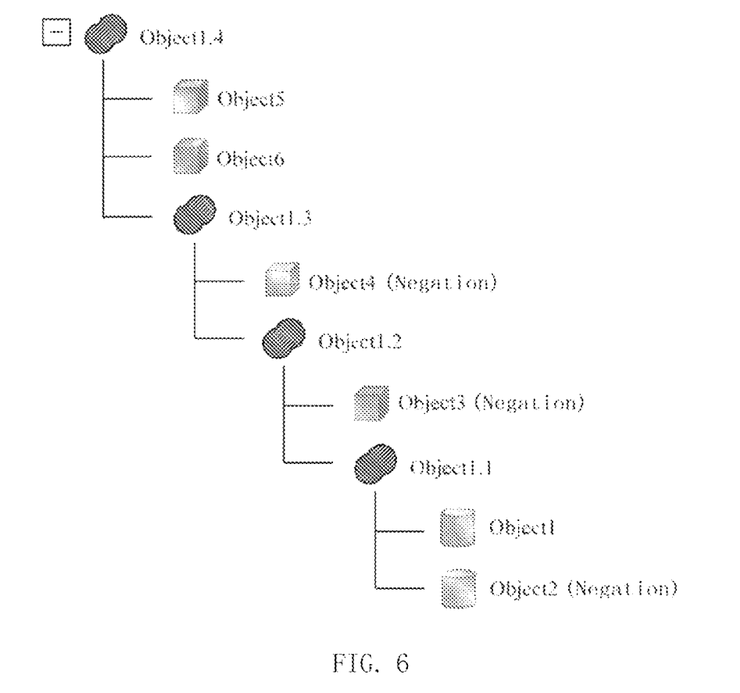
FIG. 6 is a schematic diagram that all objects with sub-nodes in a resource list are in an expanded state.

FIG. 6 is a schematic diagram of all objects with sub-nodes in a resource list in an expanded state. As shown in FIG. 6, as the example discussed in FIG. 5, all objects with sub-nodes are in an expanded state.

Figure 7:
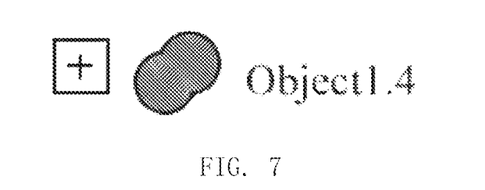
FIG. 7 is a schematic diagram that all objects with sub-nodes in a resource list are in a retracted state.

FIG. 7 is a schematic diagram of all objects with sub-nodes in a resource list in a retracted state. As shown in FIG. 7, as the example discussed in FIG. 5, all objects with sub-nodes are in a retracted state.

Optionally, when the object with sub-nodes is switched from the retracted state to the expanded state, the object with sub-nodes and the object that is set as a sub-node are set to be displayed in the resource list. The geometry corresponding to the object with sub-nodes is set to be hidden in the space window, and the geometry corresponding to the object that is set as a sub-node is set to be displayed.

As the example discussed in FIG. 7, when the object Object1.4 with sub-nodes is switched from the retracted state to the expanded state, the object Object1.4 with sub-nodes and the objects Object5, Object6, Object1.3 that are set as sub-nodes in the resource list are set to be displayed. The geometry Geometry1.4 corresponding to the object Object1.4 with sub-nodes in the space window is set to be hidden, and the geometries Geometry5, Geometry6, Geometry1.3 corresponding to the objects Object5, Object6, Object1.3 that are set as sub-nodes are set to be displayed.

Optionally, if the geometry corresponding to the object that is set as a sub-node is a composite geometry, the object corresponding to the composite geometry is switched from the retracted state to the expanded state.

If the geometry corresponding to the object that is set as a sub-node is a composite geometry, the object corresponding to the composite geometry has sub-nodes, and therefore also includes the expanded state and the retracted state.

As the example discussed above, because the geometry Geometry1.3 corresponding to the object Object1.3 that is set as a sub-node is a composite geometry, the object Object1.3 corresponding to the composite geometry is switched from the retracted state to the expanded state. The object Object1.3 with sub-nodes and the objects Object4 (negation), Object1.2 that are set as sub-nodes are set to be displayed in the resource list. The geometry Geometry1.3 corresponding to the object Object1.3 with sub-nodes is set to be hidden in the space window. The geometries Geometry4 (negation), Geometry1.2 corresponding to the objects Object4 (negation), Object1.2 that are set as sub-nodes are set to be displayed.

Because the geometry Geometry1.2 corresponding to the object Object1.2 that is set as a sub-node is a composite geometry, the object Object1.2 corresponding to the composite geometry is switched from the retracted state to the expanded state. The object Object1.2 with sub-nodes and the objects Object3 (negation), Object1.1 that are set as sub-nodes are set to be displayed in the resource list. The geometry Geometry1.2 corresponding to the object Object1.2 with sub-nodes is set to be hidden in the space window. The geometries Geometry3 (negation), Geometry1.1 corresponding to the objects Object3 (negation), Object1.1 that are set as sub-nodes are set to be displayed.

Because the geometry Geometry1.1 corresponding to the object Object1.1 that is set as a sub-node is a composite geometry, the object Object1.1 corresponding to the composite geometry is switched from the retracted state to the expanded state. The object Object1.1 with sub-nodes and the objects Object1, Object2 (negation) that are set as sub-nodes are set to be displayed in the resource list. The geometry Geometry1.1 corresponding to the object Object1.1 with sub-nodes is set to be hidden in the space window. The geometries Geometry1, Geometry2 (negation) corresponding to the objects Object1, Object2 (negation) that are set as sub-nodes are set to be displayed.

Finally, all objects with sub-nodes can be switched from the retracted state to the expanded state. Certainly, only some of the objects with sub-nodes may be expanded.

Optionally, when an object with sub-nodes is switched from the expanded state to the retracted state, it is determined whether the geometry corresponding to the object that is set as a sub-node is modified.

If the geometry corresponding to the object that is set as a sub-node is modified, the Boolean operation is performed on the modified geometry and the remaining unmodified geometry, where the Boolean operation is performed to obtain the geometry corresponding to the object with sub-nodes, so as to obtain a new composite geometry in the space window. A plurality of new objects are created in the resource list, the plurality of new objects respectively correspond to the new composite geometry, the modified geometry, and the remaining unmodified geometry, and replace the object with sub-nodes and the object that is set as a sub-node. The object corresponding to the new composite geometry is set to be displayed, and the objects corresponding to the modified geometry and the remaining unmodified geometry are set to be hidden. The new composite geometry is set to be displayed in the space window, and the modified geometry and the remaining unmodified geometry are set to be hidden.

If the geometry corresponding to the object that is set as a sub-node is not modified, the object with sub-nodes is set to be displayed in the resource list, and the object that is set as a sub-node is set to be hidden. The geometry corresponding to the object with sub-nodes is set to be displayed in the space window, and the geometry corresponding to the object that is set as a sub-node is set to be hidden.

Specifically, there may be one or more geometries to be modified. Modifications include modifying a size, a position, and a direction, etc., of the geometry. A hierarchy of the replaced object in the resource list is the same as a hierarchy of the object to be replaced in the resource list.

As the example discussed in FIG. 6, when the object Object1.4 with sub-nodes is switched from the expanded state to the retracted state, it is determined whether the geometries Geometry5, Geometry6, Geometry1.3 corresponding to the objects Object5, Object6, and Object1.3 that are set as sub-nodes are modified.

If the geometries Geometry5, Geometry6, and Geometry1.3 corresponding to the objects Object5, Object6, and Object1.3 that are set as sub-nodes are modified, for example, if the geometry Geometry5 is modified to the geometry Geometry5', the Boolean operation is performed on the modified geometry Geometry5' and the remaining unmodified geometries Geometry6, Geometry1.3. The Boolean operation is performed to obtain the geometry Geometry1.4 corresponding to the object Object1.4 with sub-nodes, that is, intersection is performed, so as to obtain a new composite geometry Geometry1.4' in the space window. A plurality of new objects Object1.4 (new), Object5 (new), Object6 (new), Object1.3 (new) are created in the resource list. The plurality of new objects Object1.4 (new), Object5 (new), Object6 (new), Object1.3 (new) respectively correspond to the new composite geometry Geometry1.4' and the modified geometry Geometry5' and the remaining unmodified geometries Geometry6, Geometry1.3, and replace the object Object1.4 with sub-nodes and the objects Object5, Object6, Object1.3 that are set as sub-nodes. The object Object1.4 (new) corresponding to the new composite geometry Geometry1.4' is set to be displayed. The objects Object5 (new), Object6 (new), and Object1.3 (new) corresponding to the modified geometry Geometry5' and the remaining unmodified geometries Geometry6, Geometry1.3 are set to be hidden. The new composite geometry Geometry1.4' is set to be displayed in the space window, and the modified geometry Geometry5' and the remaining unmodified geometries Geometry6, Geometry1.3 are set to be hidden.

If none of the geometries Geometry5, Geometry6, and Geometry1.3 corresponding to the objects Object5, Object6, and Object1.3 that are set as sub-nodes is modified, the object Object1.4 with sub-nodes is set to be displayed in the resource list, and the objects Object5, Object6, and Object1.3 that are set as sub-nodes are set to be hidden. The geometry Geometry1.4 corresponding to the object Object1.4 with sub-nodes is set to be displayed in the space window, and the geometries Geometry5, Geometry6, Geometry1.3 corresponding to the objects Object5, Object6, Object1.3 that are set as sub-nodes are set to be hidden.

Optionally, if the geometry corresponding to the object that is set as a sub-node is modified, the Boolean operation is performed on the modified geometry and the remaining unmodified geometry. The Boolean operation is performed to obtain the geometry corresponding to the object with sub-nodes, so as to obtain a new composite geometry in the space window. A plurality of new objects are created in the resource list, and the plurality of new objects respectively correspond to the new composite geometry and the modified geometry, and replace the object with sub-nodes and the object corresponding to the geometry to be modified. The object corresponding to the new composite geometry is set to be displayed, and the objects corresponding to the modified geometry and the remaining unmodified geometry are set to be hidden. The new composite geometry is set to be displayed in the space window, and the modified geometry and the remaining unmodified geometry are set to be hidden.

As the example discussed above, if the geometries Geometry5, Geometry6, and Geometry1.3 corresponding to the objects Object5, Object6, and Object1.3 that are set as sub-nodes are modified, for example, if the geometry Geometry5 is modified to the geometry Geometry5', the Boolean operation is performed on the modified geometry Geometry5' and the remaining unmodified geometries Geometry6, Geometry1.3. The Boolean operation is performed to obtain the geometry Geometry1.4 corresponding to the object Object1.4 with sub-nodes, that is, intersection is performed, so as to obtain a new composite geometry Geometry1.4' in the space window. A plurality of new objects Object1.4 (new), Object5 (new) are created in the resource list, and the plurality of new objects Object1.4 (new), Object5 (new) respectively correspond to the new composite geometry Geometry1.4' and the modified geometry Geometry5', and replace the object Object1.4 with sub-nodes and the objects Object5 corresponding to the geometry Geometry5 to be modified. The object Object1.4 (new) corresponding to the new composite geometry Geometry1.4' is set to be displayed, and the objects Object5 (new), Object6 (new), and Object1.3 (new) corresponding to the modified geometry Geometry5' and the remaining unmodified geometries Geometry6, Geometry1.3 are set to be hidden. The new composite geometry Geometry1.4' is set to be displayed in the space window, and the modified geometry Geometry5' and the remaining unmodified geometries Geometry6, Geometry1.3 are set to be hidden.

Optionally, if the geometry corresponding to the object that is set as a sub-node is modified, the Boolean operation is performed on the modified geometry and the remaining unmodified geometry, where the Boolean operation is performed to obtain the geometry corresponding to the object with sub-nodes, so as to obtain a new composite geometry in the space window. The object with sub-nodes in the resource list corresponds to the new composite geometry, and the object corresponding to the geometry to be modified corresponds to the modified geometry. The object corresponding to the new composite geometry is set to be displayed, and the objects corresponding to the modified geometry and the remaining unmodified geometry are set to be hidden. The new composite geometry is set to be displayed in the space window, and the modified geometry and the remaining unmodified geometry are set to be hidden.

Specifically, the object with sub-nodes corresponds to the new composite geometry, and no longer corresponds to the previous object, and the object corresponding to the geometry to be modified corresponds to the modified geometry, and no longer corresponds to the geometry to be modified.

As the example discussed above, if the geometries Geometry5, Geometry6, Geometry1.3 corresponding to the objects Object5, Object6, and Object1.3 that are set as sub-nodes are modified, for example, if the geometry Geometry5 is modified to the geometry Geometry5', the Boolean operation is re-performed on the modified geometry Geometry5' and the remaining unmodified geometries Geometry6, Geometry1.3, where the Boolean operation is performed to obtain the geometry Geometry1.4 corresponding to the object Object1.4 with sub-nodes, that is, intersection is performed, so as to obtain a new composite geometry Geometry1.4' in the space window. In the resource list, the object Object1.4 with sub-nodes corresponds to the new composite geometry Geometry1.4', and the object Object5 corresponding to the geometry Geometry5 to be modified corresponds to the modified geometry Geometry5'. The object Object1.4 corresponding to the new composite geometry Geometry1.4' is set to be displayed, and the objects Object5, Object6, and Object1.3 corresponding to the modified geometry Geometry5' and the remaining unmodified geometries Geometry6, Geometry1.3 are set to be hidden. The new composite geometry Geometry1.4' is set to be displayed in the space window, and the modified geometry Geometry5' and the remaining unmodified geometries Geometry6, Geometry1.3 are set to be hidden.

Optionally, if the geometry to be modified is a composite geometry, the object corresponding to the composite geometry is switched from the expanded state to the retracted state.

If the geometry to be modified is a composite geometry, the object corresponding to the composite geometry has sub-nodes, and therefore also includes the expanded state and the retracted state.

As the example discussed above, for example, the geometry Geometry1.3 is modified. Because the geometry to be modified Geometry1.3 is a composite geometry, the object Object1.3 corresponding to the composite geometry is switched from the expanded state to the retracted state. It is determined whether the geometries Geometry4 (negation), Geometry1.2 corresponding to the objects Object4 (negation), Object1.2 that are set as sub-nodes are modified. If the geometries Geometry4 (negation), Geometry1.2 corresponding to the objects Object4 (negation), Object1.2 that are set as sub-nodes are modified, for example, the geometry Geometry1.2 is modified, since the geometry to be modified Geometry1.2 is a composite geometry, the object Object1.2 corresponding to the composite geometry is switched from the expanded state to the retracted state.

It is determined whether the geometries Geometry3 (negation), Geometry1.1 corresponding to the objects Object3 (negation), Object1.1 that are set as sub-nodes are modified. If the geometries Geometry3 (negation), Geometry1.1 corresponding to the objects Object3 (negation), Object1.1 that are set as sub-nodes are modified, for example, the geometry Geometry1.1 is modified, since the geometry to be modified Geometry1.1 is a composite geometry, the object Object1.1 corresponding to the composite geometry is switched from the expanded state to the retracted state.

It is determined whether the geometries Geometry1, Geometry2 (negation) corresponding to the objects Object1, Object2 (negation) that are set as sub-nodes are modified. If the geometries Geometry1, Geometry2 (negation) corresponding to the objects Object1, Object2 (negation) that are set as sub-nodes are modified, for example, if the geometry Geometry2 (negation) is modified to the geometry Geometry2' (negation), the Boolean operation is re-performed on the modified geometry Geometry2' and the remaining unmodified geometry Geometry1. The Boolean operation is performed to obtain the geometry Geometry1.1 corresponding to the object Object1.1 with sub-nodes, that is, intersection is performed, so as to obtain a new composite geometry Geometry1.1' in the space window. In the resource list, the object Object1.1 with sub-nodes corresponds to the new composite geometry Geometry1.1', and the object Object2 (negation) corresponding to the geometry to be modified Geometry2 (negation) corresponds to the modified geometry Geometry2' (negation). The object Object1.1 corresponding to the new composite geometry Geometry1.1' is set to be displayed, and the objects Object2 (negation), Object1 corresponding to the modified geometry Geometry2' (negation) and the remaining unmodified geometry Geometry1 are set to be hidden. The new composite geometry Geometry1.1' is set to be displayed in the space window, and the modified geometry Geometry2' (negation) and the remaining unmodified geometry Geometry1 are set to be hidden.

Next, the object Object1.2 corresponding to the composite geometry is switched from the expanded state to the retracted state, and the Boolean operation is performed on the modified geometry Geometry1.1' and the remaining unmodified geometry Geometry3 (negation), where the Boolean operation is performed to obtain the geometry Geometry1.2 corresponding to the object Object1.2 with sub-nodes, that is, intersection is performed, so as to obtain a new composite geometry Geometry1.2' in the space window. In the resource list, the object Object1.2 with sub-nodes corresponds to the new composite geometry Geometry1.2', and the object Object1.1 corresponding to the geometry Geometry1.1 to be modified corresponds to the modified geometry Geometry1.1'. The object Object1.2 corresponding to the new composite geometry Geometry1.2' is set to be displayed, and the objects Object1.1, Object3 (negation) corresponding to the modified geometry Geometry1.1' and the remaining unmodified geometry Geometry3 (negation) are set to be hidden. The new composite geometry Geometry1.2' is set to be displayed in the space window, and the modified geometry Geometry1.1' and the remaining unmodified geometry Geometry3 (negation) are set to be hidden.

Next, the object Object1.3 corresponding to the composite geometry is switched from the expanded state to the retracted state, and the Boolean operation is performed on the modified geometry Geometry1.2' and the remaining unmodified geometry Geometry4 (negation). The Boolean operation is performed to obtain the geometry Geometry1.3 corresponding to the object Object1.3 with sub-nodes, that is, intersection is performed, so as to obtain a new composite geometry Geometry1.3' in the space window. In the resource list, the object Object1.3 with sub-nodes corresponds to the new composite geometry Geometry1.3', and the object Object1.2 corresponding to the geometry Geometry1.2 to be modified corresponds to the modified geometry Geometry1.2'. The objects Object1.3 corresponding to the new composite geometry Geometry1.3' is set to be displayed, and the objects Object1.2, Object4 (negation) corresponding to the modified geometry Geometry1.2' and the remaining unmodified geometry Geometry4 (negation) are set to be hidden. The new composite geometry Geometry1.3' is set to be displayed in the space window, and the modified geometry Geometry1.2' and the remaining unmodified geometry Geometry4 (negation) are set to be hidden.

Next, the object Object1.4 corresponding to the composite geometry is switched from the expanded state to the retracted state, and the Boolean operation is performed on the modified geometry Geometry1.3' and the remaining unmodified geometries Geometry5, Geometry6. The Boolean operation is performed to obtain the geometry Geometry1.4 corresponding to the object Object1.4 with sub-nodes, that is, intersection is performed, so as to obtain a new composite geometry Geometry1.4' in the space window. In the resource list, the object Object1.4 with sub-nodes corresponds to the new composite geometry Geometry1.4', and the object Object1.3 corresponding to the geometry Geometry1.3 to be modified corresponds to the modified geometry Geometry1.3'. The object Object1.4 corresponding to the new composite geometry Geometry1.4' is set to be displayed, and the objects Object1.3, Object5, Object 6 corresponding to the modified geometry Geometry1.3' and the remaining unmodified geometries Geometry5, Geometry 6 are set to be hidden. The new composite geometry Geometry1.4' is set to be displayed in the space window, and the modified geometry Geometry1.3' and the remaining unmodified geometries Geometry5, Geometry 6 are set to be hidden.

Finally, all objects with sub-nodes can be switched from the expanded state to the retracted state. Certainly, only some of the objects with sub-nodes may be retracted.

Figure 8:
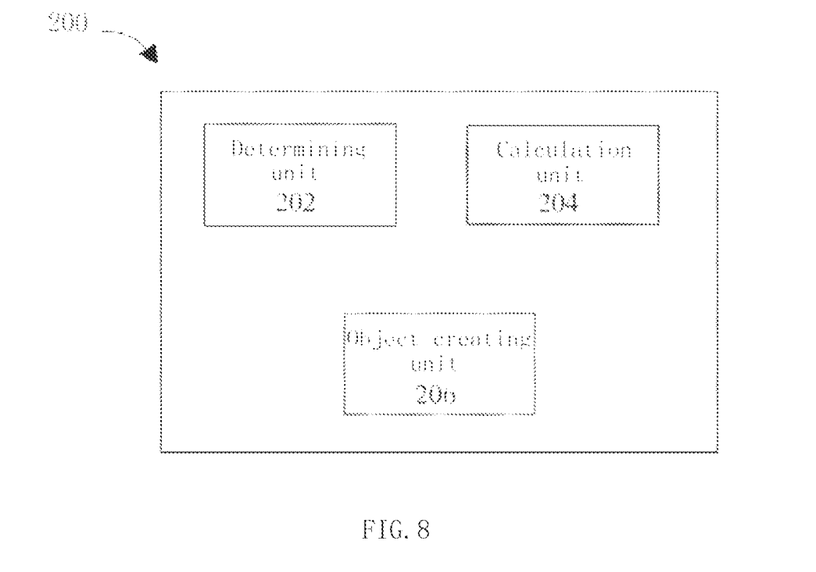
FIG. 8 is a schematic structural diagram of a system for displaying a geometry in an editor.

A second embodiment of the present disclosure relates to a system for displaying a geometry in an editor. The editor includes a space window and a resource list. FIG. 8 is a schematic structural diagram of a system for displaying a geometry in an editor. As shown in FIG. 8, the system 200 includes:

- a determining unit 202 configured to determine a Boolean operation and a plurality of geometries in the space window;
- a calculation unit 204 configured to calculate the plurality of geometries in the space window according to the Boolean operation to obtain a composite geometry in the space window;
- an object creating unit 206 configured to create a plurality of objects in the resource list, wherein the plurality of objects respectively correspond to the composite geometry and the plurality of geometries that are calculated to obtain the composite geometry, and set the objects corresponding to the plurality of geometries as sub-nodes of an object corresponding to the composite geometry; and
- return to the determining unit 202, when the determining unit determines that there is no Boolean operation, the composite geometry obtained by the calculation unit in the space window is a final composite geometry, and the plurality of objects created by the object creating unit in the resource list are final objects Optionally, when the plurality of geometries in the space window are determined, the plurality of geometries comprise a composite geometry.

Optionally, if the geometry corresponding to an object that is set as a sub-node is a composite geometry, the object creating unit further creates a plurality of objects in the resource list, wherein the plurality of objects respectively correspond to the plurality of geometries that are calculated to obtain the composite geometry, and set the plurality of objects as sub-nodes of the object that is set as a sub-node.

Optionally, the object with sub-nodes comprises an expanded state and a retracted state.

Figure 9:
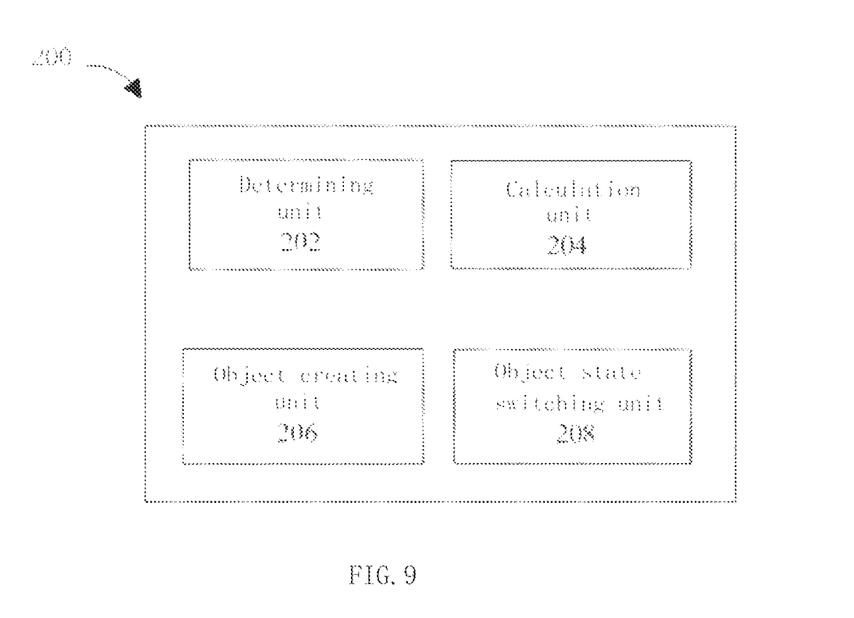
FIG. 9 is another structural diagram of a system for displaying a geometry in an editor.

FIG. 9 is another schematic structural diagram of a system for displaying a geometry in an editor. As shown in FIG. 9, optionally, the system 200 further includes an object state switching unit 208. When an object with sub-nodes is switched from an expanded state to a retracted state, the object state switching unit 208 is configured to:

- set the object with sub-nodes and the object that is set as a sub-node to be displayed in the resource list; and
- set the geometry corresponding to the object with sub-nodes to be hidden and set the geometry corresponding to the object that is set as a sub-node to be displayed in the space window.

Optionally, if the geometry corresponding to the object that is set as a sub-node is a composite geometry, the object state switching unit 208 is configured to switch the object corresponding to the composite geometry from the retracted state to the expanded state.

Optionally, the system 200 further includes an object state switching unit 208, and when an object with sub-nodes is switched from the expanded state to the retracted state, the object state switching unit 208 is configured to:

- determine whether the geometry corresponding to the object that is set as a sub-node is modified;
- if the geometry corresponding to the object that is set as a sub-node is modified, re-perform the Boolean operation on the modified geometry and the remaining unmodified geometry, wherein the Boolean operation is performed to obtain the geometry corresponding to the object with sub-nodes, so as to obtain a new composite geometry in the space window; create a plurality of new objects in the resource list, wherein the plurality of new objects respectively correspond to the new composite geometry, the modified geometry, and the remaining unmodified geometry, and replace the object with sub-nodes and the object that is set as a sub-node; set the object corresponding to the new composite geometry to be displayed, and set the objects corresponding to the modified geometry and the remaining unmodified geometry to be hidden; set the new composite geometry be displayed, and set the modified geometry and the remaining unmodified geometry to be hidden in the space window; and
- if no geometry corresponding to the object that is set as a sub-node is modified, set the object with sub-nodes to be displayed and set the object that is set as a sub-node to be hidden in the resource list; set the geometry corresponding to the object with sub-nodes to be displayed and set the geometry corresponding to the object that is set as a sub-node to be hidden in the space window.

Optionally, if the geometry corresponding to the object that is set as a sub-node is modified, the Boolean operation is re-performed on the modified geometry and the remaining unmodified geometry, wherein the Boolean operation is performed to obtain the geometry corresponding to the object with sub-nodes, so as to obtain a new composite geometry in the space window; a plurality of new objects are created in the resource list, and the plurality of new objects respectively correspond to the new composite geometry and the modified geometry, and replace the object with sub-nodes and the object corresponding to the geometry to be modified; the object corresponding to the new composite geometry is set to be displayed, and the objects corresponding to the modified geometry and the remaining unmodified geometry are set to be hidden; the new composite geometry is set to be displayed and the modified geometry and the remaining unmodified geometry are set to be hidden in the space window.

Optionally, if the geometry corresponding to the object that is set as a sub-node is modified, the Boolean operation is re-performed on the modified geometry and the remaining unmodified geometry, and the Boolean operation is performed to obtain the geometry corresponding to the object with sub-nodes, so as to obtain a new composite geometry in the space window; in the resource list, the object with sub-nodes corresponds to the new composite geometry, and the object corresponding to the geometry to be modified corresponds to the modified geometry; the object corresponding to the new composite geometry is set to be displayed, and the objects corresponding to the modified geometry and the remaining unmodified geometry are set to be hidden; the new composite geometry is set to be displayed and the modified geometry and the remaining unmodified geometry are set to be hidden in the space window.

Optionally, if the geometry to be modified is a composite geometry, the object state switching unit 208 is used to switch the object corresponding to the composite geometry from the expanded state to the retracted state.

The first embodiment is a method embodiment corresponding to this embodiment, and this embodiment can be implemented in cooperation with the first embodiment. The related technical details mentioned in the first embodiment are still valid in this embodiment. In order to reduce repetition, details are not described herein. Correspondingly, the related technical details mentioned in this embodiment can also be applied in the first embodiment.

A third embodiment of the present disclosure relates to a device for displaying a geometry in an editor. The device includes a memory storing a computer-executable instruction and a processor. The processor is configured to execute the instruction to implement a method for displaying a geometry in an editor.

The first embodiment is a method embodiment corresponding to this embodiment, and this embodiment can be implemented in cooperation with the first embodiment. The related technical details mentioned in the first embodiment are still valid in this embodiment. In order to reduce repetition, details are not described herein. Correspondingly, the related technical details mentioned in this embodiment can also be applied in the first embodiment.

A fourth embodiment of the present disclosure relates to a non-volatile computer storage medium encoded with a computer program. The computer program includes an instruction. The instruction is executed by more than one computer to implement a method of displaying a geometry in an editor.

The first embodiment is a method embodiment corresponding to this embodiment, and this embodiment can be implemented in cooperation with the first embodiment. The related technical details mentioned in the first embodiment are still valid in this embodiment. In order to reduce repetition, details are not described herein. Correspondingly, the related technical details mentioned in this embodiment can also be applied in the first embodiment.

It should be noted that all method implementations of the present disclosure can be implemented in software, hardware, firmware, and the like. Regardless of whether the present disclosure is implemented in software, hardware, or firmware, an instruction code can be stored in any type of computer accessible memory (for example, permanent or modifiable, volatile or nonvolatile, solid or non-solid, fixed or replaceable media, etc.). Similarly, the memory may be, for example, programmable array logic (Programmable Array Logic, "PAL"), a random access memory (Random Access Memory, "RAM"), and a programmable read only memory (Programmable Read Only Memory, "PROM"), a read-only memory (Read-Only Memory, "ROM"), an electrically erasable programmable read only memory (Electrically Erasable Programmable ROM, "EEPROM"), a magnetic disk, an optical disc, a digital versatile disc (Digital Versatile Disc, "DVD"), and so on.

It should be noted that each unit/module mentioned in each device embodiment of the present disclosure is a logical unit/module. Physically, a logical unit/module may be a physical unit, may be a part of a physical unit, or may be implemented in a combination of plurality of physical units. The physical implementation of these logical units is not most important. The combination of functions implemented by these logical units is the key to solving the technical problem raised in the present disclosure. Furthermore, in order to highlight the inventive part of the present disclosure, the device embodiments of the present disclosure do not introduce units which are not closely related to solving the technical problems raised in the present disclosure, which does not indicate that the device embodiments do not have other units.

It is to be noted that in the claims and description of the patent, relational terms such as first and second and the like are used merely to distinguish one entity or operation from another entity or operation, without necessarily requiring or implying any such actual relationship or order between such entities or operations. Moreover, the terms "comprises," "comprising," or any other variation thereof, are intended to cover a non-exclusive inclusion, such that a process, a method, an article, or a device that includes a list of elements includes not only those elements but also other elements not expressly listed, or further includes elements inherent to such process, method, article, or device. Without further limitation, an element defined by the statement "comprising one" does not rule out there are additional identical elements in the process, method, article, or device that includes the element.

While the present invention has been illustrated and described with reference to certain preferred embodiments thereof, it should be understood by a person of ordinary skill in the art that various changes may be made in form and detail without departing from the spirit and scope of the present disclosure.

The invention claimed is:

1. A method for displaying a geometry in an editor, wherein the editor comprises a space window and a resource list, and the method comprising:

determining a Boolean operation and a plurality of geometries in the space window; calculating the plurality of geometries in the space window according to the Boolean operation to obtain a composite geometry in the space window;

creating a plurality of objects in the resource list, wherein the plurality of objects respectively correspond to the composite geometry and the plurality of geometries that are calculated to obtain the composite geometry, and setting objects corresponding to the plurality of geometries as sub-nodes of an object corresponding to the composite geometry; and returning to the determining the Boolean operation and the plurality of geometries in the space window until it is determined that there is no Boolean operation such that the obtained composite geometry in the space window is a final composite geometry and the plurality of objects created in the resource list are final objects;

wherein when the plurality of geometries in the space window are determined, the plurality of geometries comprise a composite geometry; and wherein if a geometry corresponding to an object that is set as a sub-node is a composite geometry, a plurality of objects are further created in the resource list, wherein the plurality of objects respectively correspond to the plurality of geometries that are calculated to obtain the composite geometry, and the plurality of objects are set as sub-nodes of the object that is set as a sub-node.

2. The method according to claim 1, wherein the object with sub-nodes comprises an expanded state and a retracted state.

3. The method according to claim 2, wherein when the object with sub-nodes is switched from the retracted state to the expanded state, the object with sub-nodes and the object that is set as a sub-node are set to be displayed in the resource list; and the geometry corresponding to the object with sub-nodes is set to be hidden in the space window, and the geometry corresponding to the object that is set as a sub-node is set to be displayed.

4. The method according to claim 3, wherein if the geometry corresponding to the object that is set as a sub-node is a composite geometry, the object corresponding to the composite geometry is switched from the retracted state to the expanded state.

5. The method according to claim 2, wherein when the object with subnodes is switched from the expanded state to the retracted state, it is determined whether the geometry corresponding to the object that is set as a sub-node is modified;

if the geometry corresponding to the object that is set as a sub-node is modified, the Boolean operation is re-performed on the modified geometry and any remaining unmodified geometries of the plurality of geometries, wherein the Boolean operation is performed to obtain the geometry corresponding to the object with sub-nodes, so as to obtain a new composite geometry in the space window; a plurality of new objects are created in the resource list, wherein the plurality of new objects respectively correspond to the new composite geometry, the modified geometry, and the remaining unmodified geometry, and replace the object with sub-nodes and the object that is set as a sub-node; the object corresponding to the new composite geometry is set to be displayed, and the objects corresponding to the modified geometry and the remaining unmodified geometry are set to be hidden; the new composite geometry is set to be displayed and the modified geometry and the remaining unmodified geometry are set to be hidden in the space window; and if no geometry corresponding to the object that is set as a sub-node is modified, the object with sub-nodes is set to be displayed and the object that is set as a sub-node is set to be hidden in the resource list; the geometry corresponding to the object with sub-nodes is set to be displayed and the geometry corresponding to the object that is set as a sub-node is set to be hidden in the space window.

6. The method according to claim 5, wherein if the geometry corresponding to the object that is set as a sub-node is modified, the Boolean operation is re-performed on the modified geometry and the remaining unmodified geometry, wherein the Boolean operation is performed to obtain the geometry corresponding to the object with sub-nodes, so as to obtain a new composite geometry in the space window; a plurality of new objects are created in the resource list, wherein the plurality of new objects respectively correspond to the new composite geometry and the modified geometry, and replace the object with sub-nodes and the object corresponding to the geometry to be modified; the object corresponding to the new composite geometry is set to be displayed, and the objects corresponding to the modified geometry and the remaining unmodified geometry are set to be hidden; the new composite geometry is set to be displayed and the modified geometry and the remaining unmodified geometry are set to be hidden in the space window.

7. The method according to claim 5, wherein if the geometry corresponding to the object that is set as a sub-node is modified, the Boolean operation is re-performed on the modified geometry and the remaining unmodified geometry, and the Boolean operation is performed to obtain the geometry corresponding to the object with sub-nodes, so as to obtain a new composite geometry in the space window; in the resource list, the object with sub-nodes corresponds to the new composite geometry, and the object corresponding to the geometry to be modified corresponds to the modified geometry; the object corresponding to the new composite geometry is set to be displayed, and the objects corresponding to the modified geometry and the remaining unmodified geometry is set to be hidden; the new composite geometry is set to be displayed and the modified geometry and the remaining unmodified geometry are set to be hidden in the space window.

8. The method according to claim 5, wherein if the geometry to be modified is a composite geometry, the object corresponding to the composite geometry is switched from the expanded state to the retracted state.

9. A device for displaying a geometry in an editor, wherein the editor comprises a space window and a resource list, and the device comprising:

at least one processor; and memory communicatively coupled to the at least one processor;

wherein the memory stores instruction which, when executed by the at least one processor, causes the at least one processor to:

determine a Boolean operation and a plurality of geometries in the space window;

calculate the plurality of geometries in the space window according to the Boolean operation to obtain a composite geometry in the space window;

create a plurality of objects in the resource list, wherein the plurality of objects respectively correspond to the composite geometry and the plurality of geometries that are calculated to obtain the composite geometry, and set the objects corresponding to the plurality of geometries as sub-nodes of an object corresponding to the composite geometry; and return to determine the Boolean operation and the plurality of geometries in the space window until it is determined that there is no Boolean operation such that the obtained composite geometry in the space window is a final composite geometry and the plurality of objects created in the resource list are final objects;

wherein when the plurality of geometries in the space window are determined, the plurality of geometries comprise a composite geometry; wherein if the geometry corresponding to an object that is set as a sub-node is a composite geometry, a plurality of objects are further created in the resource list, wherein the plurality of objects respectively correspond to the plurality of geometries that are calculated to obtain the composite geometry, and set the plurality of objects as sub-nodes of the object that is set as a sub-node.

10. The device according to claim 9, wherein the object with sub-nodes comprises an expanded state and a retracted state.

11. The device according to claim 10, wherein when the object with sub-nodes is switched from the retracted state to the expanded state, the object with sub-nodes and the object that is set as a sub-node are set to be displayed in the resource list; and the geometry corresponding to the object with sub-nodes is set to be hidden in the space window, and the geometry corresponding to the object that is set as a sub-node is set to be displayed.

12. The device according to claim 11, wherein if the geometry corresponding to the object that is set as a sub-node is a composite geometry, the object corresponding to the composite geometry is switched from the retracted state to the expanded state.

13. The device according to claim 10, when the object with sub-nodes is switched from the expanded state to the retracted state, it is determined whether the geometry corresponding to the object that is set as a sub-node is modified;

if the geometry corresponding to the object that is set as a sub-node is modified, re-perform the Boolean operation on the modified geometry and any remaining unmodified geometries of the plurality of geometries, wherein the Boolean operation is performed to obtain the geometry corresponding to the object with sub-nodes, so as to obtain a new composite geometry in the space window; a plurality of new objects are created in the resource list, wherein the plurality of new objects respectively correspond to the new composite geometry, the modified geometry, and the remaining unmodified geometry, and replace the Ser. No. 17/277,695; PCNUSW20C737T 6 object with sub-nodes and the object that is set as a sub-node; the object corresponding to the new composite geometry is set to be displayed, and the objects corresponding to the modified geometry and the remaining unmodified geometry are set to be hidden; the new composite geometry is set to be displayed, and the modified geometry and the remaining unmodified geometry are set to be hidden in the space window; and if no geometry corresponding to the object that is set as a sub-node is modified, the object with sub-nodes is set to be displayed and set the object that is set as a sub-node is set to be hidden in the resource list; the geometry corresponding to the object with sub-nodes is set to be displayed and the geometry corresponding to the object that is set as a sub-node is set to be hidden in the space window.

14. The device according to claim 13, wherein if the geometry corresponding to the object that is set as a sub-node is modified, the Boolean operation is re-performed on the modified geometry and the remaining unmodified geometry, wherein the Boolean operation is performed to obtain the geometry corresponding to the object with sub-nodes, so as to obtain a new composite geometry in the space window; a plurality of new objects are created in the resource list, and the plurality of new objects respectively correspond to the new composite geometry and the modified geometry, and replace the object with sub-nodes and the object corresponding to the geometry to be modified; the object corresponding to the new composite geometry is set to be displayed, and the objects corresponding to the modified geometry and the remaining unmodified geometry are set to be hidden; the new composite geometry is set to be displayed and the modified geometry and the remaining unmodified geometry are set to be hidden in the space window.

15. The device according to claim 13, wherein if the geometry corresponding to the object that is set as a sub-node is modified, the Boolean operation is re-performed on the modified geometry and the remaining unmodified geometry, and the Boolean operation is performed to obtain the geometry corresponding to the object with sub-nodes, so as to obtain a new composite geometry in the space window; in the resource list, the object with sub-nodes corresponds to the new composite geometry, and the object corresponding to the geometry to be modified corresponds to the modified geometry; the object corresponding to the new composite geometry is set to be displayed, and the objects corresponding to the modified geometry and the remaining unmodified geometry are set to be hidden; the new composite geometry is set to be displayed and the modified geometry and the remaining unmodified geometry are set to be hidden in the space window.

16. The device according to claim 13, wherein if the geometry to be modified is a composite geometry, the object corresponding to the composite geometry is switched from the expanded state to the retracted state.

* * * * *